United States Patent
Tsai

(10) Patent No.: US 6,180,445 B1
(45) Date of Patent: Jan. 30, 2001

(54) METHOD TO FABRICATE HIGH Q INDUCTOR BY REDISTRIBUTION LAYER WHEN FLIP-CHIP PACKAGE IS EMPLOYED

(75) Inventor: Chao-Chieh Tsai, Hsih-Chu (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/556,422

(22) Filed: Apr. 24, 2000

(51) Int. Cl.[7] .............................................. H01L 21/8234
(52) U.S. Cl. ............................................ 438/238; 438/381
(58) Field of Search .................................. 438/238, 381, 438/55, 26, 106–108

(56) References Cited

U.S. PATENT DOCUMENTS

| | | | |
|---|---|---|---|
| 5,541,135 | 7/1996 | Pfeifer et al. | 437/60 |
| 5,611,008 | 3/1997 | Yap | 385/14 |
| 5,614,442 | * 3/1997 | Tserng . | |
| 5,747,870 | 5/1998 | Pedder | 257/531 |
| 5,973,391 | 10/1999 | Bischoff et al. | 257/678 |
| 6,005,466 | 12/1999 | Pedder | 336/200 |
| 6,114,763 | * 9/2000 | Smith | 257/738 |

* cited by examiner

Primary Examiner—H. Jay Tsai
(74) Attorney, Agent, or Firm—George O. Saile; Stephen B. Ackerman

(57) ABSTRACT

A new method is provided for the creation of a high Q inductor that can be applied together with the mounting of flip chip semiconductor die on a substrate. The process of the invention starts with a semiconductor surface over which a layer of insulation and intra-metal dielectric have been deposited with interconnect patterns created in said layers of insulation and dielectric. A layer of low-K polyimide is deposited over the surface of the intra-metal dielectric, active circuits have previously been created in the substrate. After the layer of low-K polyimide has been deposited, a redistribution pattern is defined in the layer of low-K poly. Metal is deposited that forms the redistribution metal, the deposited layer of metal is planarized thereby forming the metal redistribution pattern. The inductor is next defined, the inductor is created on the surface of the layer of low-K polyimide. A layer of poly is deposited over the created inductor, back-end processing is then performed that creates openings for the BGA contact points that are to be established with the active devices in the substrate via BGA's or other methods of interconnect.

11 Claims, 3 Drawing Sheets

METHOD TO FABRICATE HIGH Q INDUCTOR BY REDISTRIBUTION LAYER WHEN FLIP-CHIP PACKAGE IS EMPLOYED

BACKGROUND OF THE INVENTION (1) Field of the Invention

The invention relates to the fabrication of integrated circuit devices, and more particularly, to a method of creating a high Q inductor by reducing the energy loss that is typically encountered by rf inductors that are employed in silicon Integrated Circuits.

(2) Description of the Prior Art

Electronic circuitry can be divided into two broad fields, one field addresses digital processing while the second field addresses the manipulation of analog signals. The vast majority of semiconductor devices that are fabricated have as function the manipulation or storage of digital information, a function that is handled by on-off conditions of switching transistors or the presence or absence of an electrical charge on capacitive components. There is however, in addition, a field of semiconductor applications that addresses the processing of analog signals. The functions of analog electronic circuitry have in previous years typically been handled by separate components such as relatively large capacitors or relatively large inductors. The separate components may have been applied in combination with digital processing capabilities whereby however a significant portion of the functional implementation has been realized by the use of for instance capacitive and inductive components in addition to and functionally collaborating with the digital components. Circuit requirements that are imposed on components that are required for analog processing have in the past limited the integration of such components into typical semiconductor integrated circuit devices.

In addition, semiconductor devices can be integrated for the creation of Radio Frequency (RF) amplifiers. A major component of typical RF amplifiers is a tuned circuit that contains inductive and capacitive components. The tuned circuit has as electrical characteristic that, dependent on and determined by the values of the inductive and capacitive components, can form an impedance that is frequency dependent which enables the tuned circuit to either form a high or a low impedance for signals of a certain frequency. In this manner the tuned circuit can either reject or pass and further amplify components of an analog signal based on the frequency of that component. This tuned circuit can therefore be used as a filter to filter out or remove signals of certain frequencies or to remove noise from a circuit configuration that is aimed at manipulating analog signals. The tuned circuit can also be used to form a high electrical impedance by using the LC resonance of the circuit and to thereby counteract the effect of parasitic capacitances that form part of a circuit. The selfresonance that is caused by the parasitic capacitance between the (spiral) inductor and the underlying substrate will limit the use of the inductor at high frequencies.

The integration of functions of analog data manipulation and analog data storage with the functions of digital data manipulation and digital data storage on one semiconductor monolithic substrate offers a number of significant advantages. For instance, manufacturing costs can be significantly reduced while power consumption for the combined functions is also reduced. As previously indicated, inductors however can typically be of significant size and therefore require a significant area of the semiconductor device to be implemented. To limit the impact of space requirements that the creation of an inductor imposes on the surface of a semiconductor device, inductors are typically formed on the surface of a substrate in a spiral form. The spiral form of the inductor however results in parasitic capacitances between the inductor wiring and the underlying substrate, due to the physical size of the inductor. These parasitic capacitances have a serious negative effect on the functionality of the created LC circuit by sharply reducing the frequency of resonance of the tuned circuit of the application.

A measure of the applicability of a created inductor that is used in the industry is the Quality factor of the inductor. The quality factor Q of an inductor is defined as follows: Q=Es/El wherein Es is the energy that is stored in the reactive portion of the component while El is the energy that is lost in the reactive portion of the component. The higher the quality of the component, the closer the resistive value of the component approaches zero while the Q factor of the component approaches infinity. The quality factor for components differs from the quality that is associated with filters or resonators. For components, the quality factor serves as a measure of the purity of the reactance (or the susceptance) of the component which can be degraded due to parasitics. In an actual configuration, there are always some physical resistors that will dissipate power thereby decreasing the power that can be recovered. The quality factor Q is dimensionless. A Q value of greater than 100 is considered very high for discrete inductors that are mounted on the surface of Printed Circuit Boards. For inductors that form part of an integrated circuit, the Q value is typically in the range between about 3 and 10.

In creating an inductor on a monolithic substrate on which additional semiconductor devices are created, the parasitic capacitances that occur as part of this creation limit to about 10 the quality factor that can be achieved for the inductor using the conventional silicon process. This limitation is, for many applications, not acceptable. Dependent on the frequency at which the LC circuit is designed to resonate, significantly larger values of quality factor, of for instance 100 or more, must be available. Prior Art has in this been limited to creating values of higher quality factors as separate units, and in integrating these separate units with the surrounding device functions. This negates the advantages that can be obtained when using the monolithic construction of creating both the inductor and the surrounding devices on one and the same semiconductor substrate. The non-monolithic approach also has the disadvantage that additional wiring is required to interconnect the sub-components of the assembly thereby again introducing additional parasitic capacitances and resistive losses over the interconnecting wiring network. For many of the applications of the RF amplifier, such as portable battery powered applications, power consumption is at a premium and must therefore be as low as possible. By raising the power consumption, the effects of parasitic capacitances and resistive power loss can be partially compensated but there are limitations to even this approach. These problems take on even greater urgency with the rapid expansion of wireless applications such as portable telephones and the like. Wireless communications is a rapidly expanding market where the integration of RF integrated circuits is one of the most important challenges. One of the approaches is to significantly increase the frequency of operation to for instance the range of 10 to 100 GHz. For such high frequencies, the values of the quality factor obtained from silicon-based inductors are significantly degraded. For applications in this frequency range, monolithic inductors have been researched using other than silicon as the base for the creation of the inductors. Such monolithic inductors have for instance been created using sapphire or GaAs as a base. These inductors have a considerably lower parasitic capacitance than their silicon counterparts and therefore provide higher frequencies of resonance of the LC circuit. Where however more complex applications are required, the need still exists to create inductors using silicon as a substrate. For those applications, the approach of using a base material other than silicon has proven to be too cumbersome while for instance GaAs as a medium for the creation of semiconductor devices is as yet a technical challenge that needs to be addressed.

The incorporation of RF inductors without sacrificing device performance due to substrate losses has been extensively researched in recent years. Some of the techniques that have been used for this approach include:

the selective removing (by etching) of the silicon underneath the inductor (using methods of micro-machining)

using multiple layers of metal (such as aluminum) interconnects or of copper damascene interconnects using a high resistivity silicon substrate employing biased wells underneath a spiral conductor inserting various types of patterned ground shields between the spiral inductor and the silicon substrate increasing the thickness of the inter-layer dielectric.

The above listing of researched alternatives is not meant to be complete or all inconclusive. All of the above approaches have as common objectives to:

1) enhance the quality (Q) value of the inductor, and
2) increase the frequency of the LC self-resonance thereby increasing the frequency range over which the inductor can be used.

The invention addresses the effect that the series spreading resistance associated with the substrate will degrade the Q factor of the inductor thereby affecting the usefulness of a monolithic or integrated inductor that is implemented on silicon substrates. This effect can be overcome if the area underneath the inductor can be made to appear locally insulating by selectively removing the underlying silicon resulting in inductors that are suspended. The inductor of the invention is created above regions of Shallow Trench Isolation (STI) whereby the negative impact that an underlying layer of silicon has is further reduced by creating the inductor in a location that is (relatively far) removed from active circuitry in the surface of the substrate.

The creation of high density semiconductor packages frequently requires the use of Chip on board (COB) techniques that are used to attach semiconductor die to a Printed Circuit Board (PCB). The types of die attachments that are typically used to connect a die to a PCB include flip chip attachment, wirebonding, and tape automated bonding (TAB). The invention addresses the formation of inductors that can be applied together with flip chip attachment to a PCB or other substrate. A flip chip is a semiconductor chip that has an array of connect points spaced around an active surface of the flip chip, the flip chip is mounted face down to a substrate. The electrical connect points that are used for flip chip connections can be a Ball Grid Array (BGA) arrangement (wherein an array of minute solder balls is arranged on the surface of the flip chip that attaches to the substrate), a Slightly Larger than Integrated Circuit Carrier (SLICC) (which is similar to the BGA but has a smaller solder ball pitch and a smaller diameter than the BGA) and a Pin Grid Array (PGA) (whereby an array of small pins extends perpendicularly from the attachment surface of a flip chip, such that the pins conform to a specific arrangement on a printed circuit board or other substrate for attachment). The flip chip is bonded to the substrate by reflux or reflow of the solder balls. The solder balls may also be replaced with a conductive polymer.

U.S. Pat. No. 5,541,135 (Pfeifer et al.) shows a multi chip module having an inductor on the top polyimide layer of the flip chip.

U.S. Pat. No. 5,747,870 (Pedder) shows a flip chip assembly with an inductor on the polyimide.

U.S. Pat. No. 6,005,466 (Pedder) shows a flip chip assembly with an inductor on the polyimide.

U.S. Pat. No. 5,973,391 (Bischoff et al.) shows an inductor in a package.

U.S. Pat. No. 5,611,008 (Yap) shows a microwave package with the inductor under the surface.

SUMMARY OF THE INVENTION

A principle objective of the invention is to negate or minimize resistive losses that are typically experienced by inductive components that are mounted directly on the surface of a silicon substrate.

Another objective of the invention is to provide a method of creating a high Q inductor by applying a layer of low-K dielectric between the high Q inductor and the silicon substrate and that simultaneously functions as a redistribution layer of the metal connects that must be established when connecting a flip chip to a substrate.

In accordance with the objectives of the invention a new method is provided for the creation of a high Q inductor that can be applied together with the mounting of flip chip semiconductor die on a substrate. The process of the invention starts with a semiconductor surface over which a layer of insulation and intra-metal dielectric have been deposited with interconnect patterns created in said layers of insulation and dielectric. A layer of low-K polyimide is deposited over the surface of the intra-metal dielectric, active circuits have previously been created in the substrate. After the layer of low-K polyimide has been deposited, a redistribution pattern is defined in the layer of low-K poly. Metal is deposited that forms the redistribution metal, the deposited layer of metal is planarized thereby forming the metal redistribution pattern. The inductor is next defined, the inductor is created on the surface of the layer of low-K polyimide. A layer of poly is deposited over the created inductor, back-end processing is then performed that creates openings for the BGA contact points that are to be established with the active devices in the substrate via BGA's or other methods of interconnect.

BRIEF DESCRIPTION OF THE DRAWINGS

FIG. 2 shows the contours of a typical inductor, as follows:

DESCRIPTION OF THE PREFERRED EMBODIMENTS

Polyimides are used in the art for the advantages that are being offered by the application of polyimide as dielectric layers, among others for providing partial planarization of a dielectric surface. Polyimides are characterized by:

they produce surfaces in which the step heights of underlying features are reduced, and step slopes are gentle and smooth they are available to fill small openings without producing the avoids that occur when low-temperature CVD oxide films are deposited the cured polyimide films can tolerate temperatures of up to 500 degrees C. without degradation of their dielectric film characteristics polyimide films have dielectric breakdowns, which are only slightly lower than that of $SiO_2$ the dielectric constant of polyimides is smaller than that of silicon nitride and of $SiO_2$, and the process used to deposit and pattern polyimide films is relatively simple.

Figure 1:
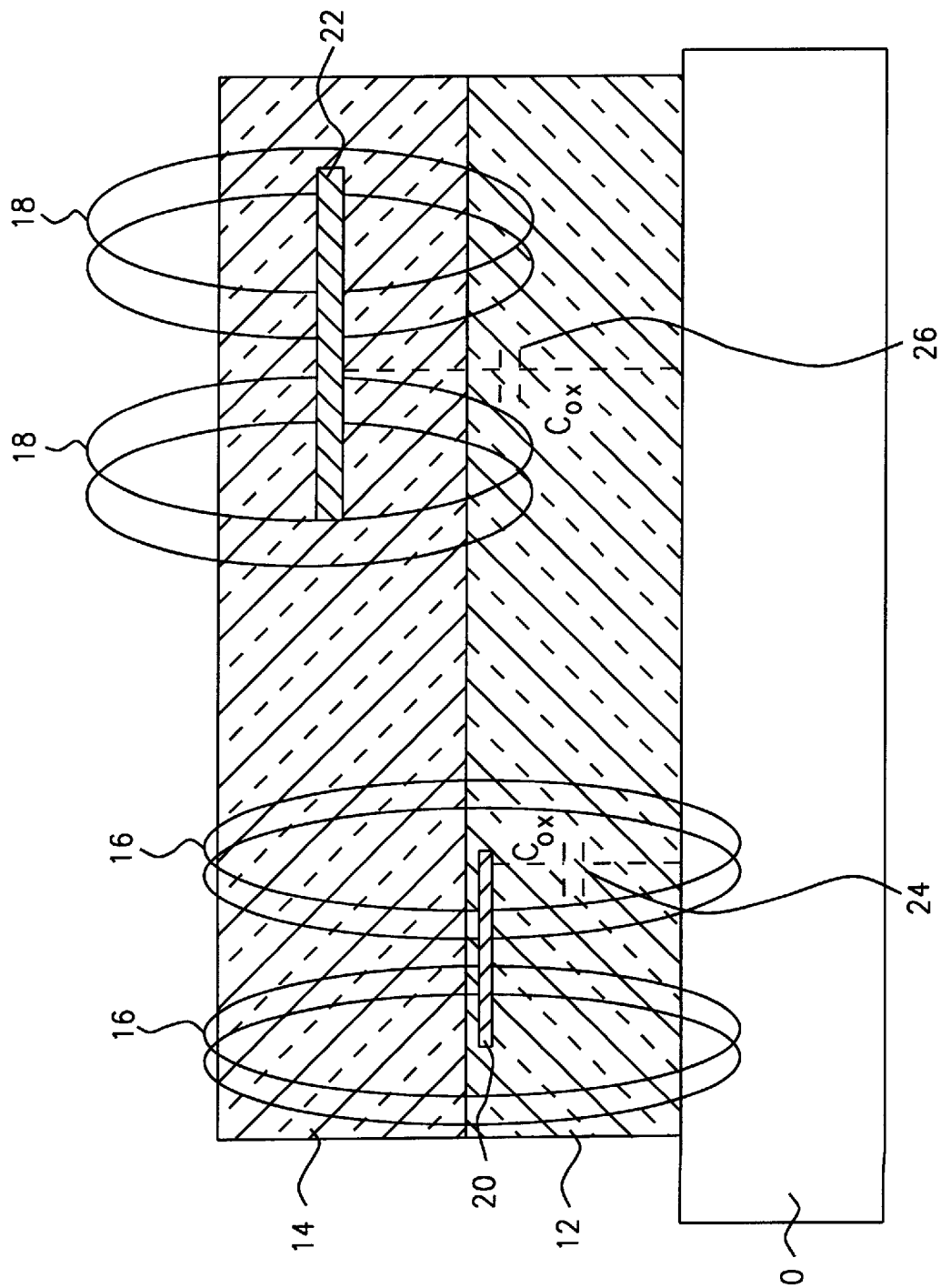
FIG. 1 Highlights two different methods of forming a high Q inductor.

Referring now specifically to FIG. 1, there is shown a cross section of two layers 12 and 14 of respectively low-K poly and poly that have been deposited over the surface of a substrate 10. The areas that have been highlighted as areas 20 and 22 represent two inductors that have been created in these locations, each having a spiral inductor pattern. In this 16 represent the electromagnetic field that surrounds the inductor 20 while 18 represent the electromagnetic field that surrounds the inductor 22. Inductor 20 is of lower Q value and of lower inductive value than inductor 22, which is the result of the constraints that are placed on inductor 20 relative to inductor 22 due to the location of the two inductors relative to the underlying silicon substrate 10. The low-K poly layer 12 limits the expansion of the electromagnetic field around the inductor 22 resulting in this electromagnetic field 18 being less intense than the electromagnetic field 16. The diameter of circles 16 is therefore larger that the diameter of circles 18. From FIG. 1 it is clear that electromagnetic field 18 does not pass through the underlying substrate 10, the resistive loss ($R_{si}$) that is experienced by electromagnetic field 18 is therefore less that the resistive loss that is experienced by the electromagnetic field 16. In order to further increase the Q factor of the inductor, the capacitive value of the layer of dielectric that is between the respective inductors and the surface of the silicon substrate must be minimized. It is clear that the value of the dielectric capacitance 24 is larger than the value of dielectric capacitance 26 due to the closer proximity of the surface of inductor 20 to the surface of the substrate 10 when compared with the proximity of inductor 22 to the surface of the substrate 10. This further increases the Q value of inductor 22 relative to the Q value of inductor 20. In sum: by increasing the distance between the inductor and the surface of the substrate (22 as compared with 20), the Q value of the inductor that is created at the extended distance increases when compared with the inductor that is created in closer proximity to the substrate as long as this further removal from the surface of the substrate does not result in increased penetration of the electromagnetic field of the removed inductor into the surface of the substrate. The latter requirement places restrictions on the materials that can be used to affect this increase in distance, low-K polyimide (of layer 12) meets this requirement, which is one of the reasons that low-K polyimide is provided for the process of the invention.

Figure 2A:
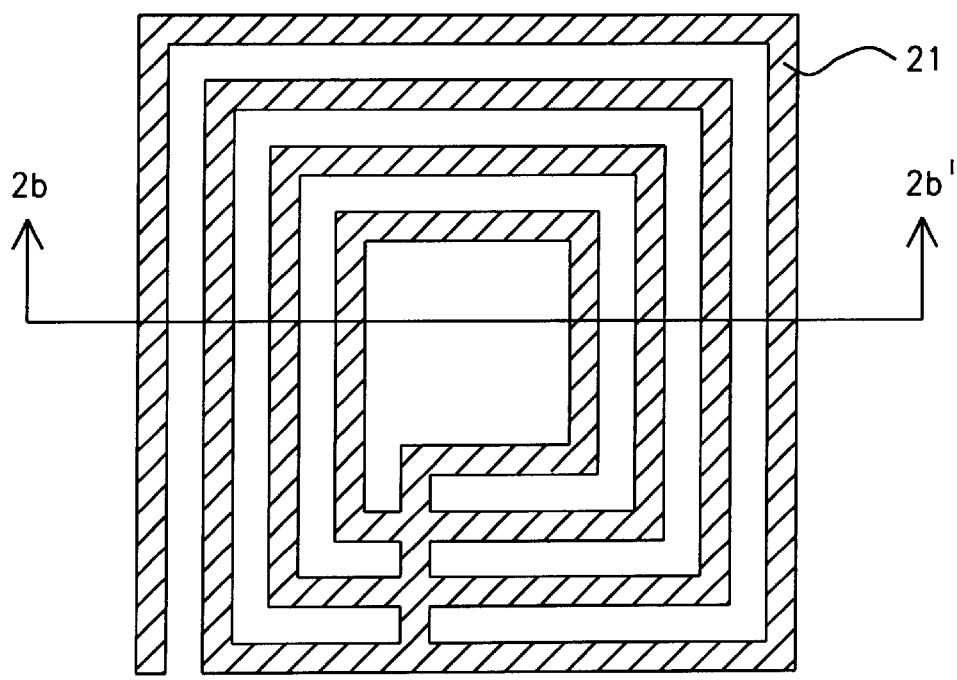
FIG. 2a s a top view of a typical inductor construction.

FIG. 2a shows a top view of a typical inductor 21, the inductor 21 that is shown in FIG. 2 is representative of inductors 20 and 22 of FIG. 1 and is of spiral form. The inductor 21 is created on the surface of a silicon substrate 10, a stress relieve layer 11 of silicon oxide (SiO2) has first been deposited over the surface of the substrate 10.

Figure 2B:
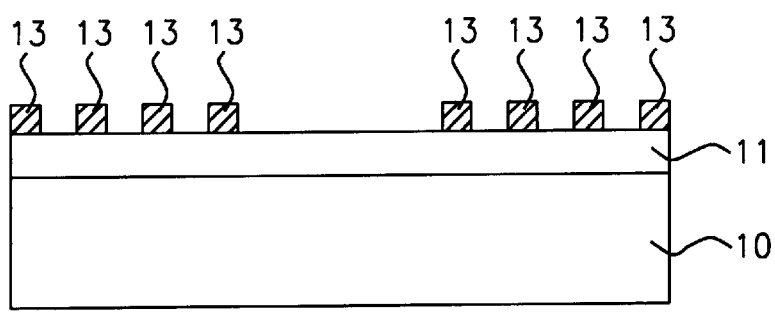
FIG. 2b shows a cross section of a typical inductor.

FIG. 2b shows a cross section of the inductor 21 taken along the line 2b–2b' of FIG. 2a with the silicon substrate 10. Also shown are the cross section pattern 13 and the layer 11 of $SiO_2$ that is first deposited over the surface of substrate 10.

Figure 3:
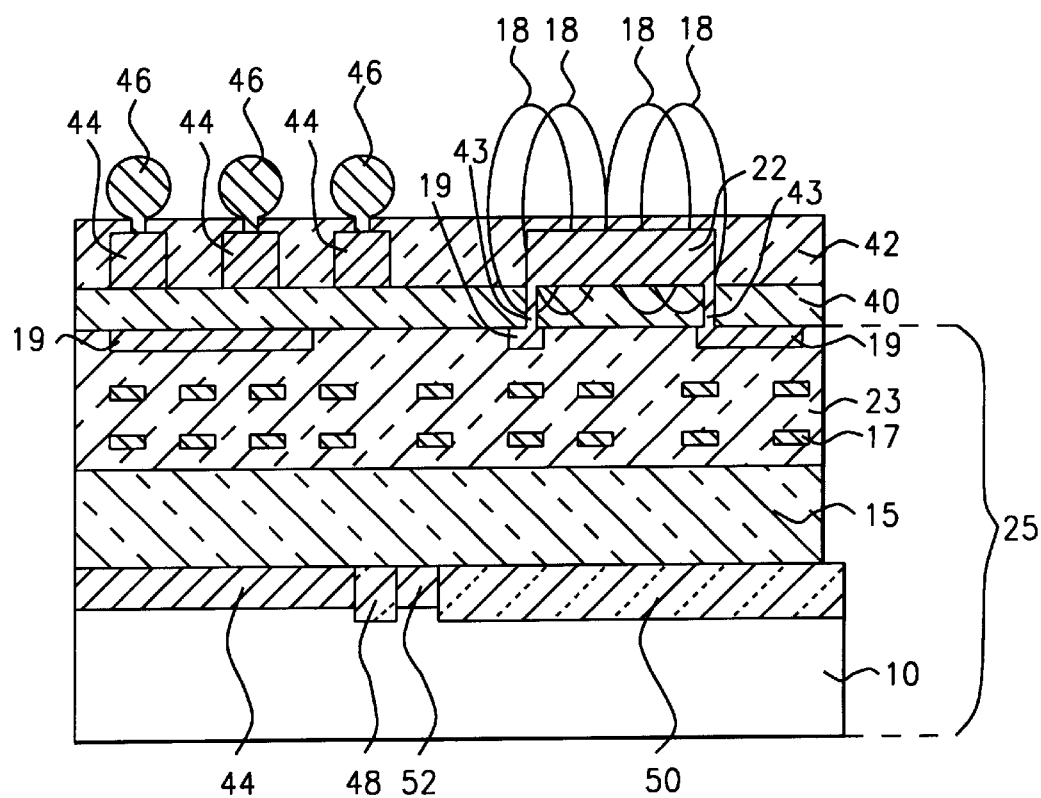
FIG. 3 shows a cross section of a substrate on the surface of which has been formed an inductor according to the process of the invention together with BGA interconnect points.

FIG. 3 addresses the process of the invention for the creation of an inductor whereby this inductor is applied in an environment of flip chip applications. The three layers that are shown in cross section in FIG. 3 are the layer 25 that represents a conventional Integrated Circuit (IC), the layer 40 of low-K polyimide that has been deposited on the surface of the IC 25 and the layer 42 of polyimide that has been deposited on the surface of the layer 40 of low-K polyimide. The layer 25 contains a semiconductor layer 10 over which a layer 15 of dielectric or insulation has been deposited over which a layer 23 of intra-metal dielectric has been deposited whereby interconnect metal lines 17 have been created in the layer 23 of intra-metal dielectric. The combined thickness of layers 15 and 23 is typically about 6 um.

Contact pads 19 are the pads to which electrical interconnects are created with both the active devices (contained in active region 44) and the to be created and overlying one or more inductors. After layer 40 of low-K polyimide has been deposited and since this layer 40 covers the surface of the active devices, that is region 44 in the surface of substrate 10, in addition to covering connect points for the to be created inductor, access points to the points of electrical contact 19 in the surface of the IC 11 must be established. This is done using a via etch whereby the electrical points of contact can be redistributed over the surface of layer 40 of low-K poly and may therefore have a pattern in this latter surface that differs from the pattern of electrical contact points as is exists in the surface of IC 11. Highlighted are the vias 43 that have been created for the connection of the to be created inductor 22. Metal is deposited after the redistribution via etch has been completed. The metal is planarized using methods of CMP whereby electrical points of contact are established in the surface of layer 40 of low-K poly. The inductor 22 is next created using conventional methods as are well known in the art, inductor 22 overlies the surface of layer 40 and is located above the region of the second STI 50. After the inductor 22 has been created, the layer 42 of polyimide is deposited over the surface of layer 40 thereby including the surface of inductor 22. Remains to be completed is the establishment of points of contact for the flip chip devices that are to be connected above the active region 44 of the substrate 10. This creation requires steps of pattering and etching to create openings in layer 42 that align with points of electrical contact in the active region of the surface of layer 40. Metal 44 is deposited into these openings and planarized after which contact balls 46 can be provided for.

The layer 40 of low-K poly polyimide can have a thickness in excess of about 10 um (after curing), The range of polyimide thickness can vary from 2 um. to 20 um, dependent on electrical design requirements. The polyimide layer 40 can be spin-on coated and cured. After spin-on coating, the polyimide will be cured at 400 degrees C. for 1 hour in a vacuum or nitrogen ambient. For thicker polyimide, the polyimide film can be multiple coated and cured. The same comments apply to the layer 42 of polyimide. The dielectric constant of layer 40 of the invention is about 3 whereby a lower value of the dielectric constant is more suited to the desired reduction in the parasitic capacitance that exists between the to be created inductor and the surface of the substrate 10.

The etching of layer 42 of polyimide is typically an anisotropic etch with an etchant gas of one of the group of CF4, $CHF_3$, $CHCl_3$, $CCl_4$, $BCl_4$ and $Cl_2$ at a temperature between about 100and 200 degrees C.

FIG. 3 shows how the method of the invention can be further enhanced with the creation of Shallow Trench Isolation regions 48 and 50 in the surface of the substrate 10.

STI's regions 48 and 50 can be made using a number of methods. For instance, one method is the Buried Oxide (BOX) isolation used for shallow trenches. The method involves filling the trenches with a chemical vapor deposition (CVD) silicon oxide ($SiO_2$) and then etched back or mechanically or chemically polished to yield a planar surface. The shallow trenches etched for the BOX process are anisotropically plasma etched into the silicon substrate and are typically between 0.2 and 0.5 micrometer (um.) deep. STI are formed around the active device to a depth between 2000 and 5000 Angstrom.

Another approach in forming STI's is to deposit silicon nitride on thermally grown oxide. After deposition of the nitride, a shallow trench is etched into the substrate using a mask. A layer of oxide is then deposited into the trench so that the trench forms an area of insulate dielectric which acts to isolate the devices in a chip and thus reduce the cross talk between active devices. The excess deposited oxide must be polished off and the trench planarized to prepare for the next level of metalization. The silicon nitride serves as a stop layer for the CMP polishing.

In using STI regions for VLSI technology, deep trenches are typically made in the substrate by reactive ion etching. The trenches are typically about 5–6 um. deep, about 2–3 um. wide and spaced about 2.5.–3.5 um. apart from another trench. The ULSI technology requires trenches that are deeper and spaced closer together posing new problems of field turn-on, punchthrough, gap-fill within the trenches and others. STI's can be made using, for instance, Buried Oxide (BOX) isolation for the shallow trenches. The method involves filling the trenches with a chemical vapor deposition (CVD) silicon oxide ($SiO_2$) and then etching back or mechanically/chemically polishing the $SiO_2$ to yield a planar surface. The shallow trenches etched for the BOX process are anisotropically plasma etched into the silicon substrate and are, for ULSI applications, typically between 0.5 and 0.8 micrometer (um.) deep. STI are formed around the active device to a depth between 4000 and 20000 Angstrom.

Following the forming of the trenches they are filled with a suitable dielectric material such as oxide, polyimide or an organic polymeric material, for example polyimide. While the dielectric-filled trench isolation can provide effective dielectric isolation between devices, the fundamental disadvantage of this scheme is that the resulting structure tends to be non-planar. This lack of planarity is mainly due to the difference in the amount of fill that is required to fill a multiplicity of closely spaced trenches and the dielectric that is deposited on the surface of the substrate. This effect is further aggravated by the steps of bake and cure that are applied to the deposited dielectric in order to cure the dielectric and to evaporate the solvents from the dielectric.

As already has been pointed out, these effects of non-planarity of the created STI regions are, for the process of the invention, largely off-set by the deposition of the layers 40 and 42 of poly that produce surfaces in which the step heights of underlying features are reduced. It is also clear from the cross section that is shown in FIG. 3 that the STI regions of the process of the invention extend well beyond the typical dimensions of STI regions since STI region 50 is etched such that it underlies the surface area over which the inductor needs to be created and is therefore not limited in width to the extend that this is normally the case for conventional STI regions.

The cross section that is shown in FIG. 3 shows two STI regions, that is region 48 and region 50. These regions are provided as two separate regions in order to provide increased electrical insulation between the active region 44 and the surface of the substrate into which the inductor is to be connected. In addition and having the same objective there is provided a region 52 that has been doped with N+ impurities that serves to electrically and functionally separate the two STI regions 48 and 50. The objective of the creation of the two STI regions are as follows:

STI region 48 is created to electrically isolate the active devices that have been created in region 44 of the substrate from the surface in the substrate 10 to which the insulator is connected STI region 50 is created to further reduce the resistive losses that are experienced by the electromagnetic field of inductor 22 in the regions where this electromagnetic field penetrates the surface of substrate 10, this is essentially region 50 of STI. By reducing the resistive losses of the electromagnetic field, the Q value of the inductor is increased.

Also highlighted in the cross section that is shown in FIG. 3 is an N+ implant 52 that has been performed into the surface of substrate 10. This implant serves to form a diffusion barrier or regions of high electrical resistance between the STI regions. For implant 52 a typical n+ type implant of arson or phosphorous can be applied at an energy between about 25 and 75 KeV and a dose between about 5E11 and 5E13 atoms/cm$^3$. Implant 16 forms the N+ region 20 in the surface of substrate 10.

From the process of the invention it is clear that the following objective have been accomplished:

by increasing the distance between the inductor and the surface of the substrate, the capacitive coupling has been reduced between these two entities resulting in increased Q value for the inductor, by increasing the distance between the inductor and the surface of the substrate, the resistive losses (that are experienced by the electromagnetic field of the inductor in the surface of the underlying silicon substrate) are decreased further resulting in increased Q value for the inductor, by using polyimide to overlay the surface of the substrate, effects of non-planarity are reduced while reducing the strength of the electromagnetic field that can penetrate the surface of the substrate thereby further increasing the Q value of the inductor, by using a layer of low-K polyimide underlying the to be created inductor, the electromagnetic field losses that are incurred by this inductor are reduced and the Q-value for the inductor is accordingly increased, and by providing regions of STI that align with the region where the inductor is to be created, the resistive losses that are experienced by the electromagnetic field of the inductor while that field passes through the surface of the silicon substrate are decreased yet further resulting in increased Q value for the inductor.

The collective effect of the above highlighted results leads to a process of creating an inductor that meets the previously stated objectives of the invention, that is to reduce resistive losses and capacitive coupling experienced by inductive components and to thereby provide a method of creating a high Q inductor.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a high-Q inductor on a surface of a semiconductor substrate whereby said substrate is in addition used for mounting of flip chip semiconductor devices, comprising the steps of:

providing a semiconductor substrate whereby a surface of said substrate is divided into an active region adjacent to a region of electrical isolation adjacent to a region over which one or more inductors are to be created;

depositing a layer of insulation over a surface of said substrate;

depositing a layer of intra-metal dielectric over the surface of said layer of insulation;

creating a network of metal interconnects and metal points of contact in said layers of insulation including said layer of intra-metal dielectric whereby said network of metal interconnects and metal points of contact provide points of electrical contact in a surface of said layer of intra-metal dielectric whereby said points of electrical contact connect to points of electrical contact in a surface of said substrate; depositing a layer of low-K polyimide over a surface of said substrate;

creating a pattern of redistribution vias in said layer of low-K polyimide; creating a network of conductive interconnect lines in addition to creating one or more inductors on a surface of said layer of low-K polyimide;

depositing a layer of polyimide over a surface of said layer of low-K polyimide thereby including said network of conductive interconnect lines thereby furthermore including said one or more inductors on a surface of said layer of low-K polyimide; and performing backend processing thereby interconnecting said flip chips to said network of conductive interconnect lines.

2. The method of claim 1 wherein said semiconductor surface contains:

an active surface region;

a surface region overlying which one or more inductors need to be created whereby said surface region overlying which one or more inductors need to be created is separated from said active surface region by a measurable distance when measured in a lateral direction along a surface of said substrate;

a region of electrical isolation that is located between said active region and said surface region overlying which one or more inductors need to be created;

points of electrical contact in said active surface region for connection of said active devices that are contained within said active surface region; and points of electrical contact in said surface region overlying which one or more inductors need to be created for connection of said one or more inductors.

3. The method of claim 1 wherein said creating a pattern of redistribution vias in said layer of low-K polyimide comprises the steps of:

patterning said layer of low-K polyimide thereby creating openings in said layer of low-K polyimide whereby said openings align with said points of electrical contact in said active surface region for connection of said active devices with one or more active devices that have been provided in said active region of said substrate whereby said openings furthermore align with said points of electrical contact in said surface region overlying which one or more inductors need to be created for connection of said one or more inductors;

blanket depositing a layer of metal over a surface of said layer of low-K polyimide thereby filling said openings in said layer of low-K polyimide; and planarizing said layer of metal essentially down to a surface of said layer of low-K polyimide thereby leaving said deposited metal in place inside said openings in said layer of low-K polyimide.

4. The method of claim 1 wherein said backend processing comprises the steps of:

patterning said layer of polyimide thereby creating openings in said layer of polyimide that align with one or more points of electrical contact with one or more active devices that have been provided in said active region of said substrate;

blanket depositing a layer of metal over a surface of said layer of polyimide; and planarizing said layer of metal thereby establishing contact vias with one or more electrical contact points of one or more said active devices that have been provided in said active region of said substrate.

5. The method of claim 4 with the additional step of:

providing a solder mask over a surface of said layer of polyimide whereby said solder mask provides for solder connections that align with one or more points of electrical contact with one or more active devices that have been provided in said active region of said substrate;

placing contact balls over said solder mask whereby said contact balls align with one or more points of electrical contact with one or more active devices that have been provided in said active region of said substrate; and electrically connecting one or more of said contact balls through the process of reflow of said placed contact balls whereby said contact balls make electrical contact with said one or more points of electrical contact with one or more active devices that have been provided in said active region of said substrate.

6. The method of claim 1 with additional processing steps, said additional processing steps to be performed prior to said depositing a layer of insulation over a surface of said substrate, said additional processing steps comprising:

performing an N+ implant into a surface of said substrate by implanting arson or phosphorous at an energy between about 25 and 75 KeV and a dose between about 5E11 and 5E13 atoms/cm$^3$ thereby creating a region of N+ implant in a surface of said substrate whereby said region of N+ implant is located in said region of electrical isolation and immediately adjacent to said region over which one or more inductors are to be created and is furthermore immediately adjacent said latter region;

creating a trench for a first Shallow Trench Isolation in a surface of said substrate whereby said trench for a first Shallow Trench Isolation is located in said region of electrical isolation and immediately adjacent to said active region furthermore creating a trench for a second Shallow Trench Isolation in the surface of said substrate whereby said trench for a second Shallow Trench Isolation is adjacent to said N+ implant and underlies said surface region of said substrate over which one or more inductors are to be created; and depositing a layer electrically isolating material in said trench for a first Shallow Trench Isolation and in said trench for a second Shallow Trench Isolation and planarizing a surface of said deposited layer of electrically isolating material down to a surface of said substrate.

7. The method of claim 6 with the addition processing steps of creating a liner of pad oxide on the inside surfaces of said trench for said first Shallow Trench Isolation and said trench for said second Shallow Trench Isolation to a thickness of between about 100 and 500 Angstrom through a thermal oxidation method at a temperature of about 900 degrees C. for a time period of about 10 to 20 minutes said additional processing steps to be performed prior to said depositing a layer electrically isolating material.

8. A method of creating a high-Q inductor on a surface of a semiconductor substrate whereby flip chip semiconductor devices are additionally mounted on said semiconductor substrate, comprising the steps of:

providing a semiconductor substrate whereby a surface of said substrate is provided with active devices and corresponding points of electrical contact to said active devices in addition to being provided with one or more surfaces over which one or more inductors are to be created with corresponding points of electrical contact to said one or more inductors;

depositing a layer of insulation over a surface of said substrate;

depositing a layer of intra-metal dielectric over a surface of said layer of insulation;

creating a network of metal interconnects and metal points of contact in said layers of insulation including said layer of intra-metal dielectric whereby said network of metal interconnects and metal points of contact provide points of electrical contact in a surface of said layer of intra-metal dielectric whereby said points of electrical contact connect to points of electrical contact in a surface of said substrate; depositing a layer of low-K polyimide over a surface of said layer of intra-metal dielectric;

creating a pattern of redistribution vias in said layer of low-K polyimide further filling said pattern of redistribution vias with a conducting material whereby said pattern of redistribution vias interconnects with one or more points of electrical contact in a surface of said layer of intra-metal dielectric;

creating a network of conductive interconnect lines in addition to creating one or more inductors on a surface of said layer of low-K polyimide whereby said conductive interconnect lines align and connect with one or more points of electrical contact to said active devices whereby furthermore said one or more inductors align and connect with said points of electrical contact to said one or more inductors;

depositing a layer of polyimide over a surface of said layer of low-K polyimide thereby including said network of conductive interconnect lines thereby furthermore including said one or more inductors on a surface of said layer of low-K polyimide; and performing backend processing thereby interconnecting said flip chips to said network of conductive interconnect lines.

9. A method of creating a high-Q inductor on a surface of a semiconductor substrate whereby flip chip semiconductor devices are additionally mounted on said semiconductor substrate, comprising the steps of:

providing a semiconductor substrate whereby a surface of said substrate is provided with active devices and corresponding points of electrical contact to said active devices in addition to being provided with one or more surfaces over which one or more inductors are to be created with corresponding points of electrical contact to said one or more inductors;

depositing a layer of insulation over a surface of said substrate;

depositing a layer of intra-metal dielectric over a surface of said layer of insulation;

creating a network of metal interconnects and metal points of contact in said layers of insulation including said layer of intra-metal dielectric whereby said network of metal interconnects and metal points of contact provide points of electrical contact in a surface of said layer of intra-metal dielectric whereby said points of electrical contact connect to points of electrical contact in a surface of said substrate; depositing a layer of low-K polyimide over a surface of said layer of intra-metal dielectric;

creating a pattern of redistribution vias in said layer of low-K polyimide further filling said pattern of redistribution vias with a conducting material whereby said pattern of redistribution vias interconnects with one or more points of electrical contact in a surface of said layer of intra-metal dielectric;

creating a network of conductive interconnect lines in addition to creating one or more inductors on a surface of said layer of low-K polyimide whereby said conductive interconnect lines align and connect with one or more points of electrical contact to said active devices whereby furthermore said one or more inductors align and connect with said points of electrical contact to said one or more inductors;

depositing a layer of polyimide over a surface of said layer of low-K polyimide thereby including said network of conductive interconnect lines thereby furthermore including said one or more inductors on a surface of said layer of low-K polyimide;

patterning said layer of polyimide thereby creating openings in said layer of polyimide that align with one or more points of electrical contact with one or more active devices that have been provided in said active region of said substrate;

blanket depositing a layer of metal over a surface of said layer of low-K polyimide;

planarizing said layer of metal thereby establishing contact vias with one or more electrical contact points of one or more said active devices that have been provided in said active region of said substrate;

providing a solder mask over a surface of said layer of polyimide whereby said solder mask provides for solder connections that align with one or more contact vias with one or more electrical contact points of one or more said active devices that have been provided in said active region of said substrate;

placing contact balls over said solder mask whereby said contact balls align with one or more points of electrical contact with one or more active devices that have been provided in said active region of said substrate; and electrically connecting one or more of said contact balls through the process of reflow of said placed contact balls whereby said contact balls make electrical contact with said one or more points of electrical contact with one or more active devices that have been provided in said active region of said substrate.

10. The method of claim 9 with additional processing steps, said additional processing steps to be performed prior to said depositing a layer of insulation over a surface of said substrate, said additional processing steps comprising:

performing an N+ implant into a surface of said substrate by implanting arson or phosphorous at an energy between about 25 and 75 KeV and a dose between about 5E11 and 5E13 atoms/cm$^3$ thereby creating a region of N+ implant in a surface of said substrate whereby said region of N+ implant is located in said region of electrical isolation and immediately adjacent to said region over which one or more inductors are to be created and is furthermore immediately adjacent said latter region;

creating a trench for a first Shallow Trench Isolation in a surface of said substrate whereby said trench for a first Shallow Trench Isolation is located in said region of electrical isolation and immediately adjacent to said active region furthermore creating a trench for a second Shallow Trench Isolation in the surface of said substrate whereby said trench for a second Shallow Trench Isolation is adjacent to said N+implant and underlies said surface region of said substrate over which one or more inductors are to be created; and depositing a layer electrically isolating material in said trench for a first Shallow Trench Isolation and in said trench for a second Shallow Trench Isolation and planarizing a surface of said deposited layer of electrically isolating material down to a surface of said substrate.

11. A method of creating a high-Q inductor on a surface of a semiconductor substrate whereby flip chip semiconductor devices are additionally mounted on said semiconductor substrate, comprising the steps of:

providing a semiconductor substrate whereby a surface of said substrate is divided into an active region adjacent to a region of electrical isolation adjacent to and a region over which one or more inductors are to be created;

performing an N+ implant into a surface of said substrate thereby creating a region of N+ implant in a surface of said substrate whereby said region of N+ implant is located in said region of electrical isolation and immediately adjacent to said region over which one or more inductors are to be created and is furthermore immediately adjacent said latter region;

creating a trench for a first Shallow Trench Isolation in a surface of said substrate whereby said trench for a first Shallow Trench Isolation is located in said region of electrical isolation and immediately adjacent to said active region furthermore creating a trench for a second Shallow Trench Isolation in the surface of said substrate whereby said trench for a second Shallow Trench Isolation is adjacent to said N+ implant and underlies said surface region of said substrate over which one or more inductors are to be created;

depositing a layer of insulation over a surface of said substrate;

depositing a layer of intra-metal dielectric over the surface of said layer of insulation;

creating a network of metal interconnects and metal points of contact in said layers of insulation including said layer of intra-metal dielectric whereby said network of metal interconnects and metal points of contact provide points of electrical contact in a surface of said layer of intra-metal dielectric whereby said points of electrical contact connect to points of electrical contact in a surface of said substrate; depositing a layer of low-K polyimide over a surface of said layer of intra-metal dielectric;

creating a pattern of redistribution vias in said layer of low-K polyimide further filling said pattern of redistribution vias with a conducting material;

creating a network of conductive interconnect lines in addition to creating one or more inductors on a surface of said layer of low-K polyimide whereby said conductive interconnect lines align and connect with one or more points of electrical contact to said active devices whereby furthermore said one or more inductors align and connect with said points of electrical contact to said one or more inductors;

depositing a layer of polyimide over a surface of said layer of low-K polyimide thereby including said network of conductive interconnect lines thereby furthermore including said one or more inductors on a surface of said layer of low-K polyimide;

patterning said layer of polyimide thereby creating openings in said layer of polyimide that align with one or more points of electrical contact with one or more active devices that have been provided in said active region of said substrate;

blanket depositing a layer of metal over a surface of said layer of polyimide;

planarizing said layer of metal thereby establishing contact vias with one or more electrical contact points of one or more said active devices that have been provided in said active region of said substrate; providing a solder mask over a surface of said layer of polyimide whereby said solder mask provides for solder connections that align with one or more contact vias with one or more electrical contact points of one or more said active devices that have been provided in said active region of said substrate;

placing contact balls over said solder mask whereby said contact balls align with one or more points of electrical contact with one or more active devices that have been provided in said active region of said substrate; and electrically connecting one or more of said contact balls through the process of reflow of said placed contact balls whereby said contact balls make electrical contact with said one or more points of electrical contact with one or more active devices that have been provided in said active region of said substrate.

* * * * *